(12) United States Patent
Fong et al.

(10) Patent No.: US 6,707,023 B2
(45) Date of Patent: Mar. 16, 2004

(54) DIFFERENTIAL PHOTOELECTRIC RECEIVER CIRCUIT

(75) Inventors: Kai D. Fong, Essex Junction, VT (US); Lee F. Hartley, Castaic, CA (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 09/681,793

(22) Filed: Jun. 6, 2001

(65) Prior Publication Data

US 2001/0050333 A1 Dec. 13, 2001

(30) Foreign Application Priority Data

Jun. 13, 2000 (CA) ............................................. 2311434

(51) Int. Cl.[7] ............................................... H01J 40/14
(52) U.S. Cl. ............................ 250/214 A; 250/214 LA; 330/59
(58) Field of Search .................. 250/214 A, 214 LA, 250/214 AG, 214 C, 214 R; 330/59, 110, 308

(56) References Cited

U.S. PATENT DOCUMENTS

| | | | |
|---|---|---|---|
| 5,030,925 A | * | 7/1991 | Taylor ..................... 250/214 A |
| 5,343,160 A | | 8/1994 | Taylor |
| 5,389,778 A | | 2/1995 | Shinomiya |
| 5,742,200 A | | 4/1998 | He |
| 5,773,815 A | | 6/1998 | Stevens |

* cited by examiner

*Primary Examiner*—Kevin Pyo
(74) *Attorney, Agent, or Firm*—Ido Tuchman; Derek S. Jennings

(57) ABSTRACT

A photoelectric receiver circuit for converting an optical signal to an electrical signal, includes first and second transimpedance amplifiers, a photodiode having a first end connected to an inverting input of the first transimpedance amplifier and a second end connected to an inverting input of the second transimpedance amplifier, and a differential amplifier having inputs AC coupled to outputs of the first and second transimpedance amplifiers. Such that when higher and lower voltages are respectively applied to the non-inverting inputs of the first and second transimpedance amplifiers, a substantially constant bias voltage is maintained on the photodiode.

12 Claims, 3 Drawing Sheets

DIFFERENTIAL PHOTOELECTRIC RECEIVER CIRCUIT

BACKGROUND OF INVENTION

1. Field of the Invention

This invention relates to optical transceivers. In particular, this invention relates to a differential photoelectric receiver circuit having low noise and a wide bandwidth.

2. Background of the Invention

An infrared transceiver is a high gain, wide bandwidth system. The photoelectric sensor or front edge stage of the receiver, which converts optical energy into an electrical voltage, is critical to the operation of the transceiver. In order to design an effective photoelectric receiver many factors must be considered, two of the most important being noise and bandwidth.

Typically the front edge stage comprises a transimpedance amplifier for converting the photocurrent from a photodiode (PD) to an electrical voltage proportional to the optical intensity. For example, FIG. 1 illustrates a prior art photoelectric receiver transimpedance amplifier circuit in an infrared transceiver. The PIN diode PD which is connected between the bias power supply $V_p$ and the inverting input of the operational amplifier U provides a current in proportion to the intensity of an infrared signal striking the active area of the PIN diode PD. The non-inverting input of the operational amplifier is grounded, creating a virtual ground on the inverting input.

This circuit has the advantage of providing a constant bias on the PIN diode PD due to the virtual ground. However, the photoelectric receiver circuit of FIG. 1 has poor immunity to noise and interference because it lacks a differential structure, and therefore cannot reject common mode noise and interference. Moreover, the bias voltage $V_p$ must provide the full photocurrent, which can be as large as several tens of milliamperes, and it is very difficult to integrate into the same chip as the front edge circuit a voltage regulator which has low noise and yet provides such a large current. The noise of the voltage regulator would become the main source of noise in the system.

FIG. 2 illustrates a prior art differential photoelectric receiver. As long as R1=R2, this circuit is a differential circuit for small signals and thus provides the advantage that it has a very good common mode noise rejection ratio. The diode PD is AC coupled to the operational amplifier U through identical capacitors C1 and C2, as required in infrared communication to filter out low frequency optical noise, and the capacitors C1, C2 eliminate the effect of the PIN diode PD bias to the input bias of the differential amplifier U.

The disadvantages of the circuit of FIG. 2 are:

1) The PIN diode PD bias is not constant. When the photocurrent detected by the diode PD increases the PIN diode bias decreases, so that the parasitic capacitance of the PIN diode PD increases and the bandwidth of the diode PD decreases. Thus, when the optical power is very strong communication pulses tend to merge.

2) The bias voltage $V_p$ must provide the full photocurrent, as in the circuit of FIG. 1, which presents the same problem of implementing the photoelectric receiver circuit of FIG. 2 with a voltage regulator into a single chip.

3) Since the resistances of R1 and R2 cannot be very large (the maximum allowable resistance would be in the order of 10 kW), the capacitance of the coupling capacitors C1, C2 must be large to reach a required low cutoff frequency and would occupy a substantial area of the chip die.

U.S. Pat. No. 5,389,778 issued Feb. 14, 1995 to Shinomiya teaches a photoelectric conversion circuit utilizing transimpedance amplifiers in association with frequency selecting components comprising a tuning circuit and LC resonators. The frequency selecting components form a narrow bandwidth network, which filters out noise outside of the selected band. However, this circuit is not symmetrical and therefore cannot reject common mode noise over a wide bandwidth. Further, the PIN diode bias is supplied by the voltage source directly, so that the photocurrent, including noise from the voltage source, flows through the circuit as a load current, resulting in poor common mode noise rejection.

U.S. Pat. No. 5,343,160 issued Aug. 30, 1994 to Taylor teaches a symmetrical transimpedance amplifier circuit for a photoelectric receiver, which utilizes a combination of DC feedback loops and AC feedback loops to control the gain of the circuit. The use of AC coupling in this case reduces the low frequency performance of the circuit, and AC feedback from the operational amplifier output supplies the PIN diode bias voltage, so that when the optical signal has a wide bandwidth, the low frequency components (which are prevalent in optical communication systems) can decrease the PIN diode bias voltage due to the low frequency gain of the AC signal coupling amplifier. This increases the PIN diode parasitic capacitance and causes degradation of the high frequency performance of the circuit as well as extra phase shifting, which can lead to instability.

SUMMARY OF INVENTION

The present invention thus provides a photoelectric receiver circuit for converting an optical signal to an electrical signal, comprising: first and second transimpedance amplifiers, a photodiode having a first end connected to an inverting input of the first transimpedance amplifier and a second end connected to an inverting input of the second transimpedance amplifier, and a differential amplifier having inputs AC coupled to outputs of the first and second transimpedance amplifiers, wherein when higher and lower voltages are respectively applied to the non-inverting inputs of the first and second transimpedance amplifiers, a substantially constant bias voltage is maintained on the photodiode.

The present invention further provides an optical transceiver comprising a photoelectric receiver circuit for converting an optical signal to an electrical signal, the photoelectric receiver circuit comprising: first and second transimpedance amplifiers, a photodiode having a first end connected to an inverting input of the first transimpedance amplifier and a second end connected to an inverting input of the second transimpedance amplifier, and a differential amplifier having inputs AC coupled to outputs of the first and second transimpedance amplifiers, wherein when higher and lower voltages are respectively applied to the non-inverting inputs of the first and second transimpedance amplifiers, a substantially constant bias voltage is maintained on the photodiode.

Various other objects, features, and attendant advantages of the present invention will become more fully appreciated as the same becomes better understood when considered in conjunction with the accompanying drawings, in which like reference characters designate the same or similar parts throughout the several views.

BRIEF DESCRIPTION OF DRAWINGS

The following drawings illustrate by way of example only a preferred embodiment of the invention.

DETAILED DESCRIPTION

Figure 1:
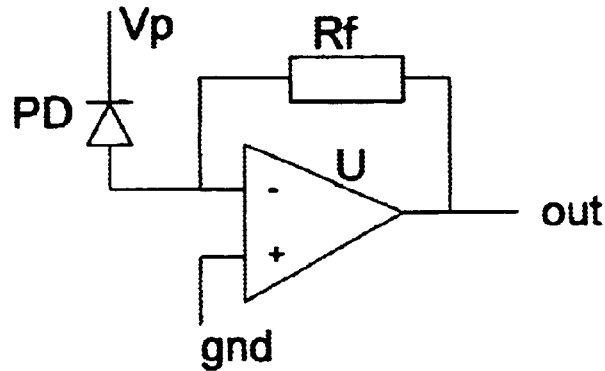
FIG. 1 is a schematic diagram of a prior art transimpedance amplifier photoelectric receiver circuit.
Figure 2:
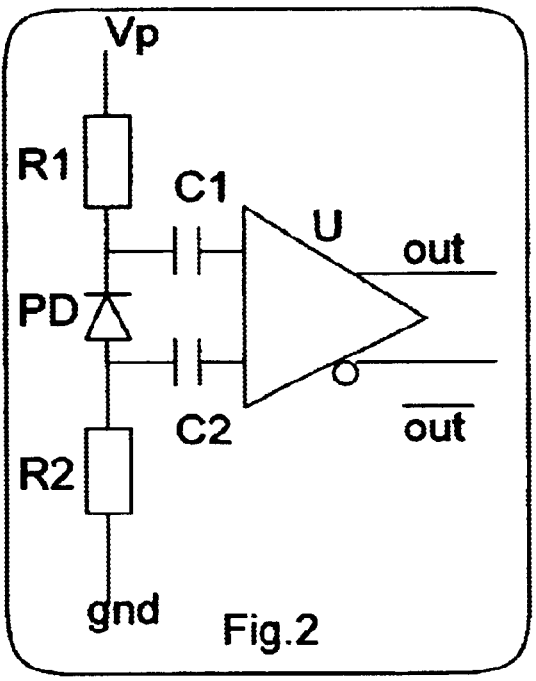
FIG. 2 is a schematic diagram of a prior art differential photoelectric receiver circuit.

The present invention overcomes these disadvantages by providing a photoelectric receiver circuit, which provides a differential structure for good common mode noise voltage rejection, and maintains a constant bias on the PIN diode.

The invention accomplishes this by providing a symmetrical front edge circuit having a transimpedance amplifier on each side of the PIN diode, the outputs of transimpedance amplifiers being AC coupled to a differential post amplifier. The differential structure of the front edge circuit of the invention provides a very high common noise voltage rejection ratio and a virtual ground to the inverting inputs of the transimpedance amplifiers.

In the preferred embodiment of the invention, a differential PIN diode bias voltage is established by separate bias voltages $V_{p1}$ and $V_{p2}$ respectively applied to the non-inverting input of each transimpedance amplifier. The PIN diode bias always equals the difference between the bias voltages, and is therefore constant. Since the photocurrent does not flow through the bias voltages, the input impedance of the operational amplifiers is very high and the current of the bias voltages $V_{p1}$ and $V_{p2}$ can be very small. Thus, a low-noise voltage regulator can be used to supply power to the bias voltages in the invention. Moreover, since the differential post amplifier can have a very high input impedance, up to several MW, the AC coupling capacitors can be very small, to conserve space on the chip die, while still achieving a required low cut off frequency.

In the preferred embodiment auxiliary DC currents are applied to both sides of the PIN diode, maintaining the PIN diode bias as high as possible and maximizing the output swing ranges of the transimpedance amplifiers, in order to retain a wide bandwidth. The DC current sources also allow the output bias voltages of the transimpedance amplifiers to be adjusted to any desired level. When the DC current sources are controlled by the transimpedance amplifier outputs through a low pass filter, the output bias offset caused by ambient light can be eliminated.

In one preferred embodiment of the invention the feedback resistors may be variable resistors, providing automatic gain control.

The invention accordingly provides a completely symmetric AC coupled analog photoelectric receiver circuit, which improves the system signal-to-noise ratio and common mode noise voltage rejection ratio. Through the use of wide bandwidth transimpedance amplifiers to convert current to voltage, the photoelectric receiver circuit of the invention can operate over a wide bandwidth. The output voltage ranges of the transimpedance amplifiers are maximized by the use of DC current sources applied to the inverting inputs of the transimpedance amplifiers, the separate voltages through virtual grounds provide constant PIN diode reverse bias independent of the PIN diode photocurrent and signal frequency. Further, due to the high input impedance of the differential post amplifier, small AC coupling capacitors can be used to conserve space on the chip die while still providing good low frequency performance and a very low low-cut off frequency, which is particularly useful for wide bandwidth applications.

In further aspects of the invention the transimpedance amplifiers each comprise an operational amplifier having an inverting input, a non-inverting input and an output, and a feedback resistor connected between the inverting input and the output; a DC current source supplies a DC current to the inverting input of each operational amplifier, the level of DC current applied to each inverting input optionally being controlled by the output of the respective transimpedance amplifiers through a low pass filter; and/or both of the feedback resistors are variable resistors to thereby provide automatic gain control.

Figure 3:
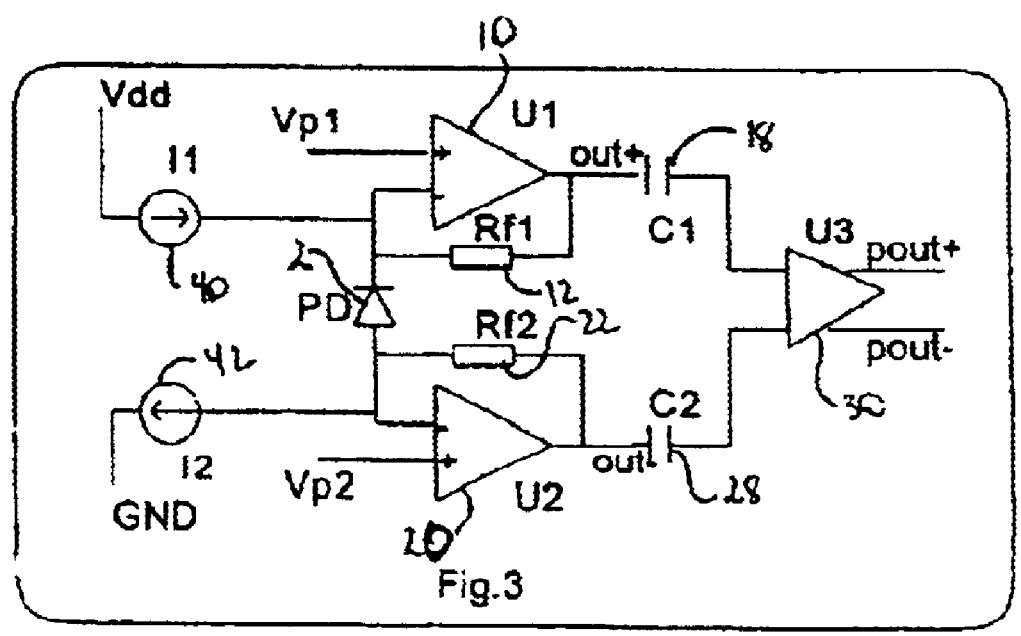
FIG. 3 is a schematic diagram of a photoelectric receiver circuit according to the present invention.

FIG. 3 illustrates a preferred embodiment of a photoelectric receiver circuit for a photoelectric transceiver in accordance with the present invention. A first transimpedance amplifier comprises a first operational amplifier 10 having a resistor 12 connecting the output to the inverting input of the operational amplifier 10, and a second transimpedance amplifier comprises a second operational amplifier 20 having a resistor 22 connecting the output to the inverting input of the operational amplifier 20. Preferably operational amplifiers 10, 20 are identical and resistors 12, 22 are identical.

One side of a photodiode, in the infrared photoelectric receiver shown a PIN diode 2, is connected to the inverting input of the first operational amplifier 10 and the other side of the PIN diode 2 is connected to the inverting input of the second operational amplifier 20. The virtual ground of the inverting inputs and the non-inverting inputs of the operational amplifiers 10, 20 maintain a reverse bias on the PIN diode 2 equal to the voltage difference between the non-inverting inputs of operational amplifiers 10, 20.

The outputs of the operational amplifiers 10, 20 are AC coupled through capacitors 18, 28 to a differential amplifier 30, which thus produces an amplified voltage between its positive and negative output terminals based on the voltage difference between the transimpedance amplifier outputs. The outputs of the operational amplifiers 10, 20 in turn vary in proportion to the photocurrent emitted by the PIN diode 2, so that the differential amplifier 30 outputs positive and negative electrical signals having a difference proportional to the intensity of light striking the PIN diode 2.

In the preferred embodiment DC current sources 40, 42 are connected to both sides of the PIN diode 2, which maximize the output swing ranges of the operational amplifiers 10, 20. DC current sources 40, 42 also allow the output bias voltage of the transimpedance amplifiers to be adjusted, as described below.

In operation, a differential PIN diode reverse bias voltage is established by bias voltage sources $V_{p1}$, $V_{p2}$ respectively applied to the non-inverting input of each transimpedance amplifier, which provide constant reverse bias on the PIN diode 2 independent of the PIN diode photocurrent and signal frequency. In the preferred embodiment DC current sources 40, 42 are connected to both sides of the PIN diode 2, which allows the output voltage of the transimpedance amplifiers to be adjusted to maximize the output swing range.

Bias voltages $V_{p1}$ and $V_{p2}$ respectively applied to the non-inverting inputs of operational amplifiers 10, 20, are preferably maintained close to the voltage limits of the power supply, so in the embodiment illustrated $V_{p1}$ is close to $V_{dd}$ and $V_{p2}$ is close to 0 V (ground). With no light striking the PIN diode 2, the PIN diode 2 is quiescent. The bias voltage $V_{p1}$ establishes a steady positive output voltage from operational amplifier 10, which if $V_{p1}$ is close to $V_{dd}$ and no current source $I_1$ exists is very high. Similarly, the bias voltage $V_{p2}$ establishes a steady negative output voltage from operational amplifier 20, which if $V_{p2}$ is close to ground and no current source $I_2$ exists is also very low. The difference between the outputs of operational amplifiers 10, 20 remains constant and the DC content is filtered out by the AC coupling capacitors 18, 28, so the output of the differential amplifier 30 is zero.

When infrared light strikes the PIN diode 2a photodiode current passes from the inverting input of operational amplifier 10 to the inverting input of operational amplifier 20. A positive current is thus established at the inverting input of operational amplifier 10 and a negative current is established at the inverting input of operational amplifier 20, the currents being proportional to the intensity of light striking the PIN diode 2. The PIN diode current drives the output of operational amplifier 10 higher (more positive) and drives the output of operational amplifier 20 lower (more negative) to the same degree.

The resulting change in the output voltages of the operational amplifiers 10, 20 respectively raises and lowers the voltages at the positive and negative inputs of the differential amplifier 30. The differential amplifier 30 thus produces an amplified output proportional to the voltage difference between the outputs of the transimpedance amplifiers.

The currents from DC current sources 40, 42 are superposed onto the PIN diode current at the respective inverting inputs of the operational amplifiers 10, 20. DC current sources 40, 42 thus allow the outputs of the operational amplifiers 10, 20 to be adjusted to any desired level, by selectively reducing or increasing the sink or source currents at the inverting inputs of the operational amplifiers 10, 20. The PIN diode bias always equals $V_{p1}$-$V_{p2}$, due to the virtual ground of inputs of the operational amplifiers 10, 20, and is therefore constant.

Since the current emitted by the PIN diode 2 is not used to generate the PIN diode bias voltage, and the input impedance of the operational amplifiers 10, 20 is very high so the current of the bias voltages $V_{p1}$ and $V_{p2}$ can be kept very small, a small low-noise voltage regulator (not shown) is sufficient to establish the bias potential on the PIN diode 2. The differential amplifier 30 can also have a very high input impedance, up to several MW, and thus the AC coupling capacitors 18, 28 can also be very small to conserve space on the chip die while still being able to reach the desired low cut-off frequency. At the same time, the differential structure of the photoelectric receiver circuit of the invention provides a high common mode noise rejection ratio.

Figure 4:
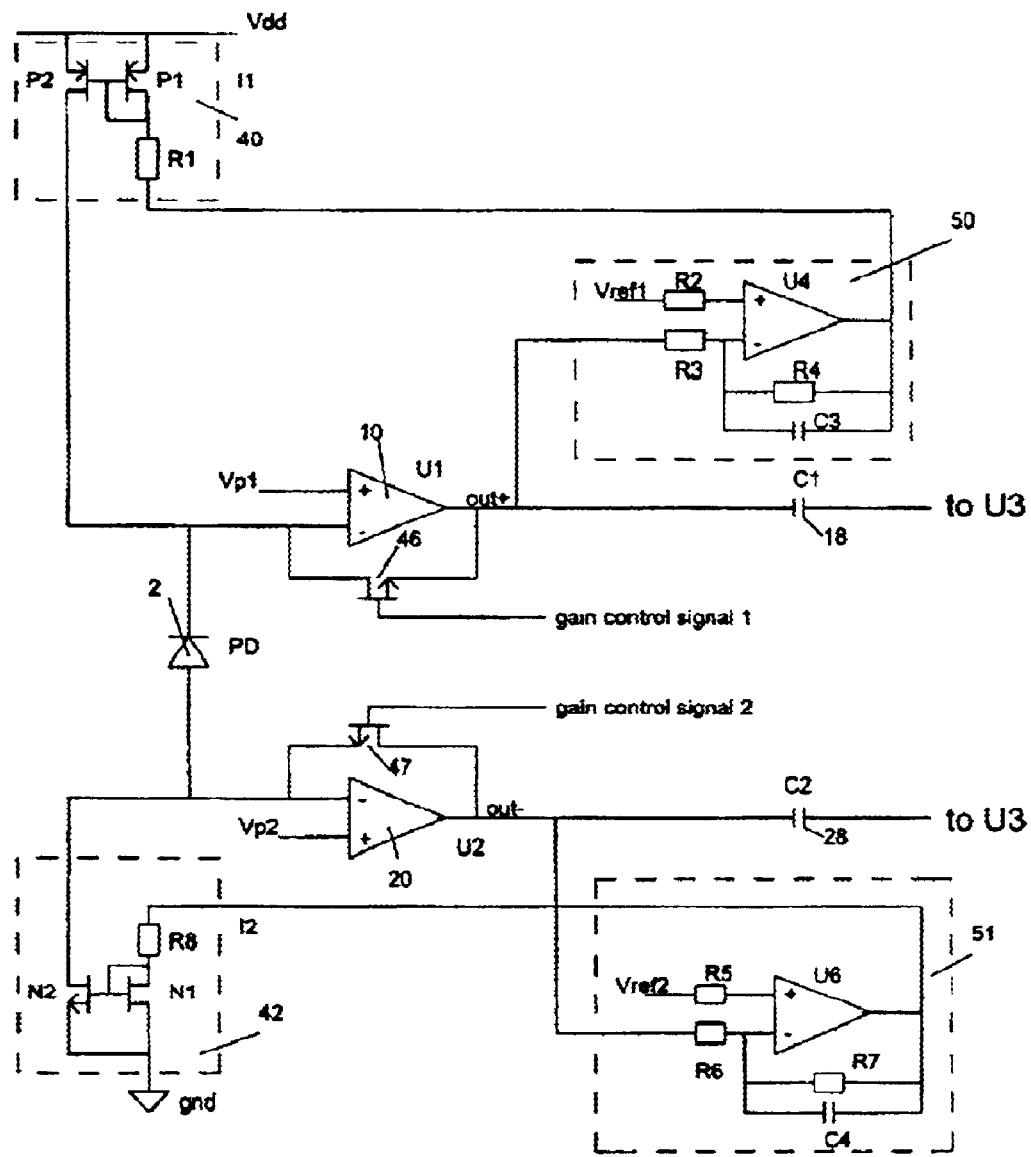
FIG. 4 is a schematic diagram of a further embodiment of a photoelectric receiver circuit according to the present invention.

In a further embodiment, illustrated in FIG. 4, the feedback resistors $R_{f1}$ and $R_{f2}$ may be variable resistors such as FETs 46, 48. This embodiment provides automatic gain control by varying the feedback current from the outputs of the operational amplifiers 10, 20. Also, as shown in the embodiment of FIG. 4 the current sources 40, 42 can be controlled by the transimpedance amplifier outputs through low pass filters 50, 51, which maximizes the output swing ranges of the operational amplifiers 10, 20 and eliminates the bias offset caused by ambient light.

The invention thus provides a completely symmetrical AC coupled wide bandwidth analog front edge circuit structure, which improves the system signal-to-noise ratio and common mode noise rejection ratio. The output voltage ranges of the transimpedance amplifiers can be maximized by the implementation of DC current sources 40, 42 applied to the inverting inputs, and the constant PIN diode reverse bias is independent of the PIN diode photocurrent and signal frequency.

In summary, a photoelectric receiver circuit provides a symmetrical sensor having a transimpedance amplifier on each side of the PIN diode, the outputs of the transimpedance amplifiers being AC coupled to a differential post amplifier. The differential structure provides a very high common noise voltage rejection ratio and a virtual ground to the inverting inputs of the transimpedance amplifiers. In the preferred embodiment a differential PIN diode bias voltage is established by separate bias voltages respectively applied to the non-inverting input of each transimpedance amplifier. Thus, a low-noise voltage regulator can be used to supply power to the bias voltages in the invention, and the AC coupling capacitors can be very small to conserve space on the chip die. Auxiliary DC currents applied to both sides of the PIN diode maintain the PIN diode bias as high as possible and maximize the output swing ranges of the transimpedance amplifiers in order to retain a wide bandwidth. The DC current sources allow the output bias voltages of the transimpedance amplifiers to be adjusted, and when controlled by the transimpedance amplifier outputs through a low pass filter, the output bias offset caused by ambient light can be eliminated. The feedback resistors may be variable resistors to provide automatic gain control.

A preferred embodiment of the invention having been thus described by way of example, certain modifications and adaptations will be apparent to those skilled in the art. The invention includes all such modifications and adaptations as fall within the scope of the claims.

What is claimed is:

1. A photoelectric receiver circuit for converting an optical signal to an electrical signal, comprising:
   first and second transimpedance amplifiers,
   a photodiode having a first end connected to an inverting input of the first transimpedance amplifier and a second end connected to an inverting input of the second transimpedance amplifier,
   a differential amplifier having inputs, AC coupled, to outputs of the first and second transimpedance amplifiers, and
   wherein when higher and lower voltages are respectively applied to the non-inverting inputs of the first and second transimpedance amplifiers, a substantially constant bias voltage is maintained on the photodiode.

2. The photoelectric receiver circuit of claim 1 in which the transimpedance amplifiers each comprise an operational amplifier having an inverting input, a non-inverting input and an output, and a feedback resistor connected between the inverting input and the output.

3. The photoelectric receiver circuit of claim 2 comprising a DC current source supplyinq a DC current to the inverting input of each operational amplifier.

4. The photoelectric receiver circuit of claim 2 wherein at least one of the feedback resistors is a variable resistor.

5. The photoelectric receiver circuit of claim 4 wherein both of the feedback resistors are variable resistors.

6. The photoelectric receiver circuit of claim 3 wherein the level of DC current applied to each inverting input is controlled by the output of the respective transimpedance amplifiers through a low pass filter.

7. An optical transceiver comprising a photoelectric receiver circuit for converting an optical signal to an electrical signal, the photoelectric receiver circuit comprising:

first and second transimpedance amplifiers, a photodiode having a first end connected to an inverting input of the first transimpedance amplifier and a second end connected to an inverting input of the second transimpedance amplifier, and a differential amplifier having inputs, AC coupled, to outputs of the first and second transimpedance amplifiers, two voltages for applying a bias voltage to the photodiode, wherein when higher and lower voltages are respectively applied to the non-inverting inputs of the first and second transimpedance amplifiers, a substantially constant bias voltage is maintained on the photodiode.

8. The optical transceiver of claim 7 in which the transimpedance amplifiers each comprise an operational amplifier having an inverting input, a non-inverting input and an output, and a feedback resistor connected between the inverting input and the output.

9. The optical transceiver of claim 8 comprising a DC current source supplying a DC current to the inverting input of each operational amplifier.

10. The optical transceiver of claim 8 wherein at least one of the feedback resistors is a variable resistor.

11. The optical transceiver of claim 10 wherein both of the feedback resistors are variable resistors.

12. The optical transceiver of claim 9 wherein the level of DC current applied to each inverting input is controlled by the output of the respective transimpedance amplifiers through a low pass filter.

* * * * *

UNITED STATES PATENT AND TRADEMARK OFFICE
CERTIFICATE OF CORRECTION

PATENT NO. : 6,707,023 B2
DATED : March 16, 2004
INVENTOR(S) : Feng et al.

It is certified that error appears in the above-identified patent and that said Letters Patent is hereby corrected as shown below:

Title page,
Item [75], Inventors, "Fong" should be -- Feng --.

Signed and Sealed this

Seventeenth Day of August, 2004

JON W. DUDAS
*Acting Director of the United States Patent and Trademark Office*